(12) United States Patent
Furutani et al.

(10) Patent No.: US 9,474,158 B2
(45) Date of Patent: Oct. 18, 2016

(54) PRINTED WIRING BOARD (71) Applicant: IBIDEN CO., LTD., Ogaki (JP)

(72) Inventors: Toshiki Furutani, Ogaki (JP); Takeshi Furusawa, Ogaki (JP); Keisuke Shimizu, Ogaki (JP); Yuichi Nakamura, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 276 days.

(21) Appl. No.: 14/329,453

(22) Filed: Jul. 11, 2014

(65) Prior Publication Data

US 2015/0016079 A1 Jan. 15, 2015

(30) Foreign Application Priority Data

Jul. 12, 2013 (JP) .................................. 2013-145986

(51) Int. Cl.
| | |
|---|---|
| H05K 1/18 | (2006.01) |
| H05K 3/46 | (2006.01) |
| H01L 23/00 | (2006.01) |
| H05K 1/02 | (2006.01) |
| H05K 1/11 | (2006.01) |
| H05K 3/00 | (2006.01) |
| H05K 3/34 | (2006.01) |
| H01L 21/56 | (2006.01) |

(52) U.S. Cl.
CPC .............. *H05K 1/185* (2013.01); *H01L 24/19* (2013.01); *H05K 3/4602* (2013.01); *H01L 21/568* (2013.01); *H01L 2224/04105* (2013.01); *H01L 2224/12105* (2013.01); *H01L 2224/16227* (2013.01); *H01L 2224/32225* (2013.01); *H01L 2224/73267* (2013.01); *H01L 2224/83005* (2013.01); *H01L 2924/1533* (2013.01); *H01L 2924/15311* (2013.01); *H01L 2924/18162* (2013.01); *H01L 2924/19105* (2013.01); *H05K 1/0203* (2013.01); *H05K 1/113* (2013.01); *H05K 3/0097* (2013.01); *H05K 3/3489* (2013.01); *H05K 3/4673* (2013.01);

(Continued)

(58) Field of Classification Search
CPC ................ H05K 1/0231; H05K 1/162–1/167; H05K 1/141–1/144
USPC ................ 361/763–766, 782–784, 790–795; 174/258–264
See application file for complete search history.

(56) References Cited

U.S. PATENT DOCUMENTS

| | | | |
|---|---|---|---|
| 6,724,638 B1* | 4/2004 | Inagaki | H01L 21/4857 257/E23.062 |
| 6,855,892 B2* | 2/2005 | Komatsu | H05K 3/4069 174/256 |

(Continued)

FOREIGN PATENT DOCUMENTS

JP 2006-222164 A 8/2006

*Primary Examiner* — Tuan T Dinh
(74) *Attorney, Agent, or Firm* — Oblon, McClelland, Maier & Neustadt, L.L.P.

(57) ABSTRACT

A wiring board includes a first resin insulation layer, an electronic component positioned on first surface of the first insulation layer, a second resin insulation layer formed on the first surface of the first insulation layer such that the second insulation layer is embedding the electronic component, a conductive layer formed on the second insulation layer, a third resin insulation layer formed on the conductive layer and second insulation layer, and a connection via conductor formed in the second insulation layer such that the connection via conductor is connecting electrode of the electronic component and conductive layer on the second insulation layer. The first insulation layer has a pad structure on second surface side of the first insulation layer on opposite side of the first surface, and the first insulation layer has coefficient of thermal expansion set lower than coefficients of thermal expansion of the second and third insulation layers.

20 Claims, 12 Drawing Sheets

(52) U.S. Cl.
CPC . *H05K 2201/068* (2013.01); *H05K 2201/094* (2013.01); *H05K 2203/1536* (2013.01); *H05K 2203/308* (2013.01)

(56) References Cited

U.S. PATENT DOCUMENTS

| | | | |
|---|---|---|---|
| 7,821,795 B2* | 10/2010 | Sugaya | H01L 23/3128 361/523 |
| 8,987,901 B2* | 3/2015 | Sasaoka | H01L 23/5389 257/737 |
| 2002/0117743 A1* | 8/2002 | Nakatani | H01L 21/4857 257/687 |
| 2006/0040463 A1 | 2/2006 | Sunohara | |
| 2007/0257761 A1* | 11/2007 | Mano | H01F 17/0006 336/200 |
| 2009/0025971 A1* | 1/2009 | Kanemaru | H01L 23/5389 174/260 |
| 2012/0227261 A1 | 9/2012 | Inui | |

\* cited by examiner

PRINTED WIRING BOARD

CROSS-REFERENCE TO RELATED APPLICATIONS

The present application is based upon and claims the benefit of priority to Japanese Patent Application No. 2013-145986, filed Jul. 12, 2013, the entire contents of which are incorporated herein by reference.

BACKGROUND OF THE INVENTION

1. Field of the Invention

The present invention relates to a printed wiring board with a built-in electronic component.

2. Description of Background Art

JP2006-222164A describes a method for embedding an electronic component in an insulation layer without using a core substrate and a method for manufacturing a semiconductor device which includes mounting an electronic component on a support board, embedding the electronic component on the support board in an insulation layer, and removing the support board. The entire contents of this publication are incorporated herein by reference.

SUMMARY OF THE INVENTION

According to one aspect of the present invention, a wiring board includes a first resin insulation layer, an electronic component positioned on a first surface of the first resin insulation layer, a second resin insulation layer formed on the first surface of the first resin insulation layer such that the second resin insulation layer is embedding the electronic component on the first surface of the first resin insulation layer, a conductive layer formed on the second resin insulation layer, a third resin insulation layer formed on the conductive layer and the second resin insulation layer, and a connection via conductor formed in the second resin insulation layer such that the connection via conductor is connecting an electrode of the electronic component and the conductive layer on the second resin insulation layer. The first resin insulation layer has a pad structure formed on a second surface side of the first resin insulation layer on the opposite side with respect to the first surface, and the first resin insulation layer has a thermal expansion coefficient which is set lower than a thermal expansion coefficient of the second resin insulation layer and a thermal expansion coefficient of the third resin insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

A printed wiring board according to a first embodiment of the present invention is described below with reference to FIGS. 1 and 2.

Figure 1:
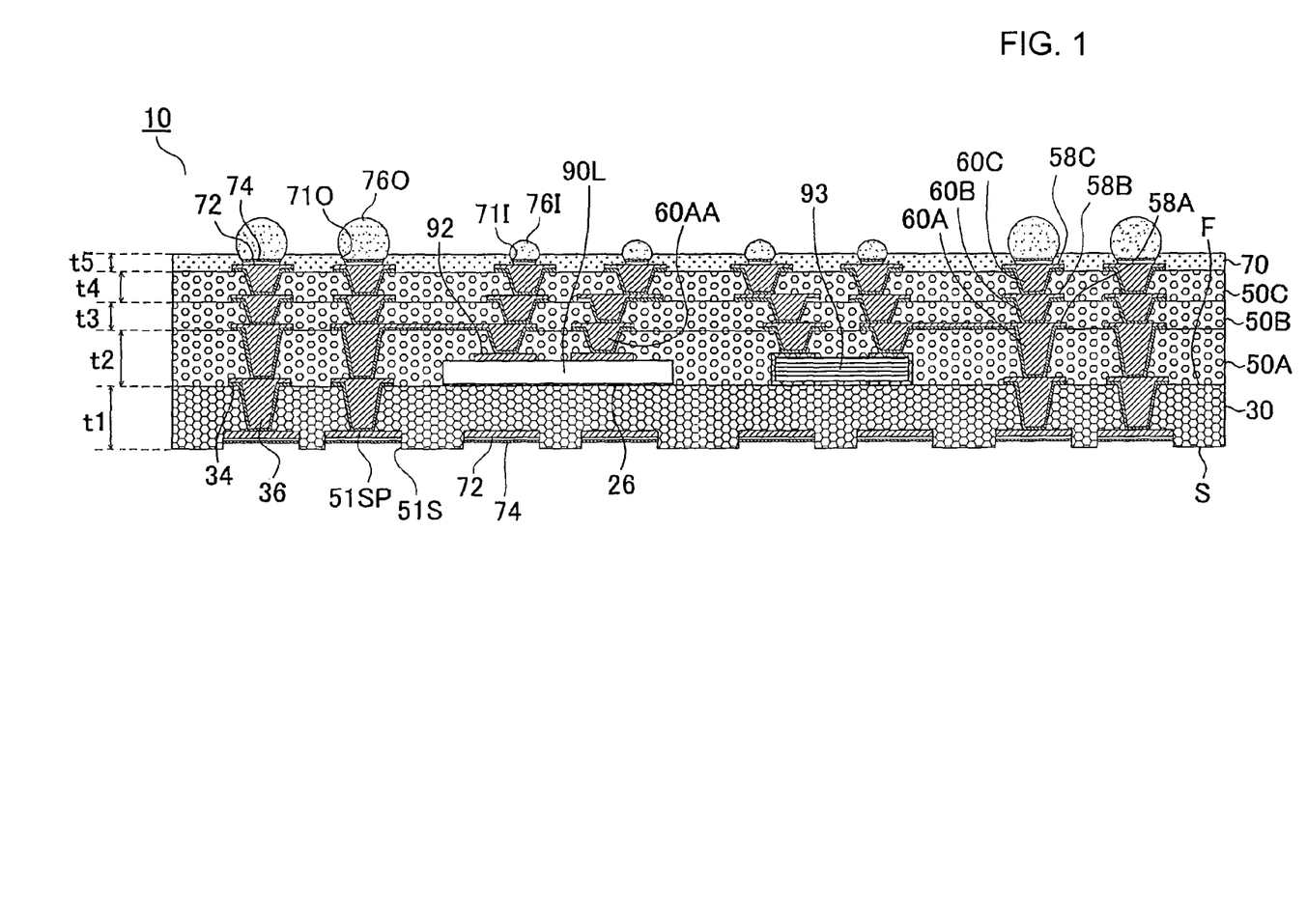
FIG. 1 is a cross-sectional view of a printed wiring board according to a first embodiment of the present invention.

FIG. 1 is a cross-sectional view of printed wiring board 10 according to the first embodiment. FIG. 2 shows a usage example of the printed wiring board according to the first embodiment. In FIG. 2, third IC chip 290 is mounted on the printed wiring board shown in FIG. 1, and package substrate 110 is further mounted on the printed wiring board of the first embodiment.

As shown in FIG. 1, printed wiring board 10 has the following: lowermost first resin insulation layer 30 having main surface (F) and secondary surface (S) opposite the main surface; pad (51SP) on the secondary-surface side of first resin insulation layer 30; first conductive layer 34 on main surface (F) of the first resin insulation layer; logic IC chip (90L) and multilayer ceramic capacitor 93 positioned on first resin insulation layer 30; second resin insulation layer (50A) which is formed on the main surface of the first resin insulation layer and is for embedding logic IC chip (90L) and multilayer ceramic capacitor 93; second conductive layer (58A) on second resin insulation layer (50A); third resin insulation layer (50B) on second resin insulation layer (50A) and on second conductive layer (58A); third conductive layer (58B) on third resin insulation layer (50B); outermost third resin insulation layer (50C) on third resin insulation layer (50B) and on third conductive layer (58B); and outermost third conductive layer (58C) on outermost third resin insulation layer (50C). In such a printed wiring board, adhesive agent 26 is provided between logic IC chip (90L) and multilayer ceramic capacitor 93 and first resin insulation layer 30. Instead of an adhesive agent, die attach made of silver paste or the like may be used. Pad (51SP) is formed in a portion recessed from the secondary surface of first resin insulation layer 30. Pad (51SP) and first conductive layer 34 are connected by via conductor 36 penetrating through the first resin insulation layer. First conductive layer 34 and second conductive layer (58A) are connected by via conductor (60A) penetrating through the second resin insulation layer. Electrode 92 of the IC chip and second conductive layer (58A) are connected by connection via conductor (60AA). Second conductive layer (58A) and third conductive layer (58B) are connected by via conductor (60B) penetrating through third resin insulation layer (50B). Third conductive layer (58B) and outermost third conductive layer (58C) are connected by via conductor (60C) penetrating through outermost third resin insulation layer (50C). Solder-resist layer 70 is formed on outermost third resin insulation layer (50C). In solder-resist layer 70, opening (71I) with a relatively small diameter is formed on the central side, and opening (71O) with a relatively large diameter is formed on a peripheral side. Smaller-diameter solder bump (76I) is formed in smaller-diameter opening (71I), and larger-diameter solder bump (76O) is formed on larger-diameter opening (71O). Here, the pitch between smaller-diameter solder bumps (76I) is less than the pitch between larger-diameter solder bumps (76O). In addition, the height of larger-diameter solder bump (76O) is greater than the height of smaller-diameter solder bump (76I).

Figure 2:
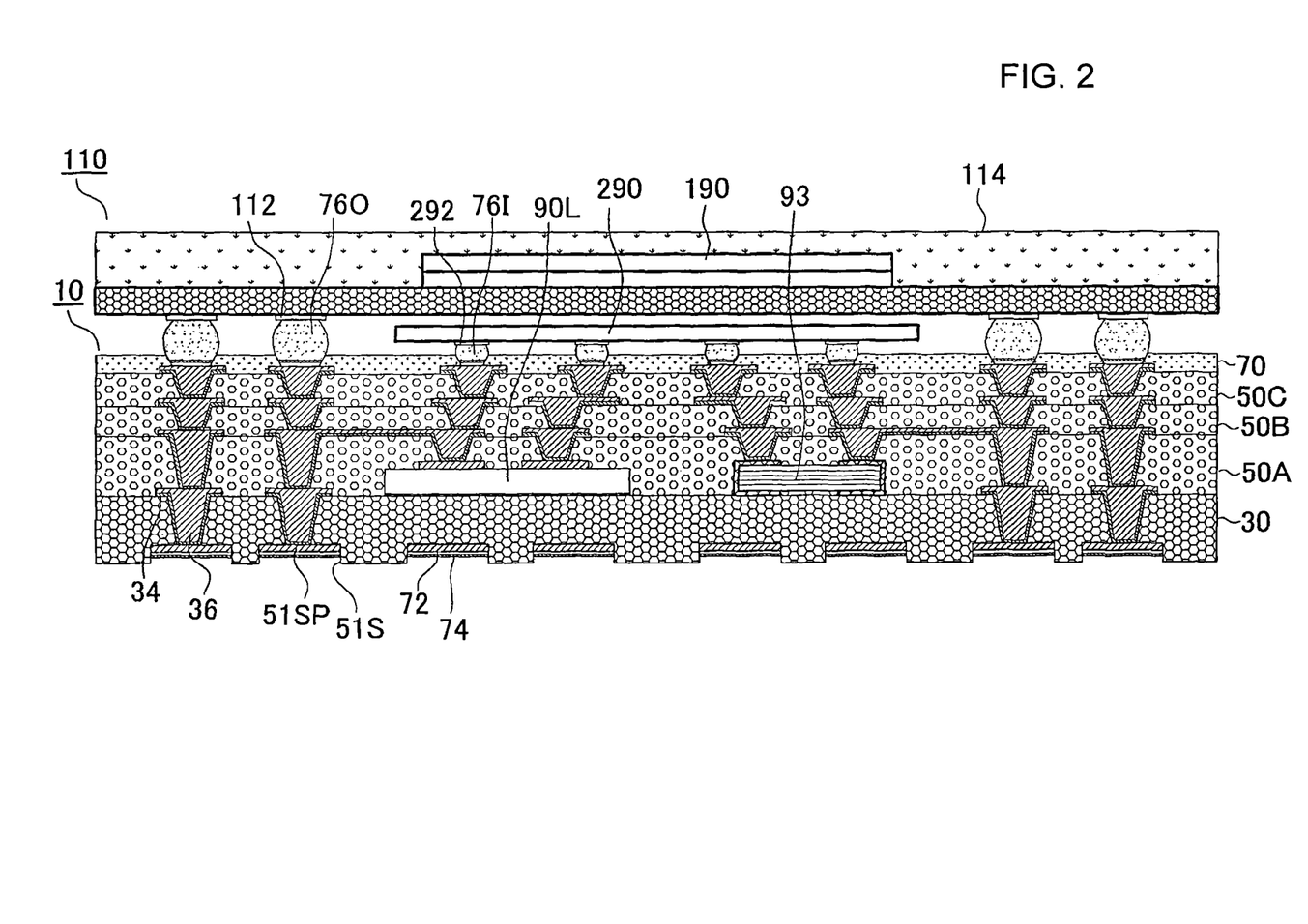
FIG. 2 is an application example of the printed wiring board shown in FIG. 1.

As shown in FIG. 2, pad 292 of third IC chip 290 is connected through smaller-diameter solder bump (76I) positioned on the central side of printed wiring board 10. Pad 112 of package substrate 110 with built-in memory chip 190 is connected through larger-diameter solder bump (76O) positioned on the peripheral side of printed wiring board 10. Memory chip 190 is encapsulated by encapsulating resin 114. A solder bump not shown in the drawing is formed on pad (51SP) in lowermost first resin insulation layer 30 to be connected to a motherboard.

In the printed wiring board of the first embodiment, first resin insulation layer 30 is formed to have thickness (t1) at 50 µm; second resin insulation layer (50A) to have thickness (t1) at 55 µm; third resin insulation layer (50B) to have thickness (t3) at 30 µm; outermost third resin insulation layer (50C) to have thickness (t4) at 30 µm; and solder-resist layer 70 to have thickness (t5) at 20 µm. Of those, the thickness of the second resin insulation layer for embedding an IC chip is set greatest. Second resin insulation layer (50A), third resin insulation layer (50B) and outermost third resin insulation layer (50C) are made with the same composition, and their CTE (coefficient of thermal expansion) is approximately 30~40 ppm. First resin insulation layer 30 is made with the same resin composition as that of second resin insulation layer (50A), third resin insulation layer (50B) and outermost third resin insulation layer (50C) except that its CTE is adjusted by the amount of inorganic filler to be 10~20 ppm, which is approximately ⅓~⅔ of the CTE of the second, third and outermost third resin insulation layers. The CTE of the solder-resist layer is adjusted to be in the mid-range between the CTE of the first resin insulation layer and the CTE of the second, third and outermost third resin insulation layers. The first, second and third resin insulation layers are made of resin containing inorganic particles of a hydroxide or the like. Examples of resin are epoxy resin, BT (bismaleimide triazine) resin and the like. Inorganic particles of a hydroxide are, for example, metal hydroxides such as aluminum hydroxide, magnesium hydroxide, calcium hydroxide, barium hydroxide and the like. The first, second and third resin insulation layers do not contain a core material. However, it is an option for the first resin insulation layer to have a core material (reinforcing material). Examples of a reinforcing material are glass cloth, aramid fiber, fiberglass and the like. Glass is preferred to be T-glass.

In a printed wiring board according to the first embodiment, under logic IC chip (90L) and multilayer ceramic capacitor 93, first resin insulation layer 30 is provided to have a lower CTE than either of the CTE of second resin insulation layer (50A) for embedding logic IC chip (90L) and multilayer ceramic capacitor 93 and the CTE of third resin insulation layers (50B, 50C) formed on the second resin insulation layer. Because of a lower CTE, the first resin insulation layer warps in a direction that lowers the peripheral sides of the first resin insulation layer, offsetting the warping in a direction that raises the peripheral sides of the second and third resin insulation layers, which have a greater CTE. Accordingly, the degree of warping of the printed wiring board is reduced, and reliability is thereby enhanced when third IC chip 290 and package substrate 110 are mounted on the printed wiring board.

In the first embodiment, since pad (51SP) is provided in recess (51S) of the first resin insulation layer, it is not necessary to form a solder-resist layer to prevent short circuiting when solder bumps are formed thereon. Thus, there is no need to form a solder-resist layer with a low CTE on the side where the first resin insulation layer is exposed. Accordingly, no solder-resist layer will inhibit the first resin insulation layer from functioning to reduce the degree of warping.

A method for manufacturing a printed wiring board according to the first embodiment is described below with reference to FIG. 1-7.

Figure 3A:
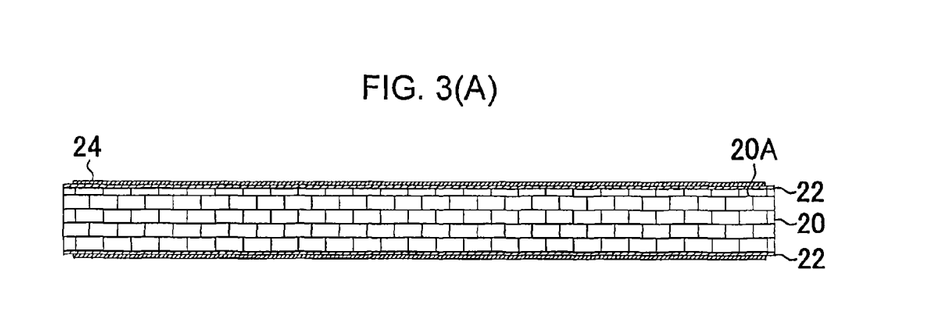
FIG. 3(A)-3(D) are views showing steps for manufacturing a printed wiring board according to the first embodiment.
Figure 3B:
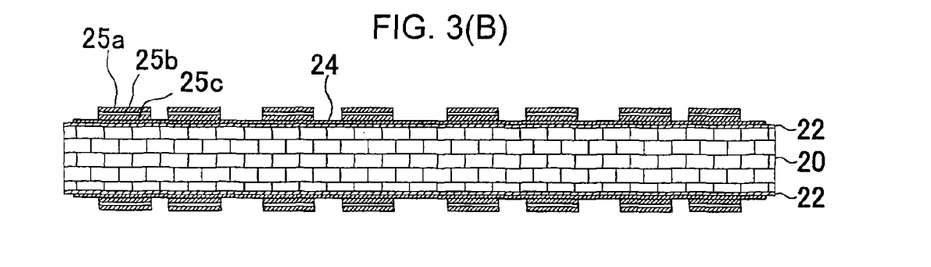

Double-sided copper-clad laminate (20A) made by laminating copper foil 22 on resin substrate 20, along with copper foil 24 with a thickness of 3~20 µm, is prepared (FIG. 3(A)). Copper foil 24 is bonded to copper foil 22 of the copper-clad laminate by using an adhesive agent or by ultrasonic bonding so that a predetermined width of the periphery of the copper-clad laminate is bonded to the periphery of the copper foil.

Plating resist (not shown) with openings is formed on copper foil 24, and copper layer (25c), nickel layer (25b) and copper layer (25a) are formed in that order in the openings by electrolytic plating. Then, the plating resist is removed (FIG. 3(B)).

Figure 3C:
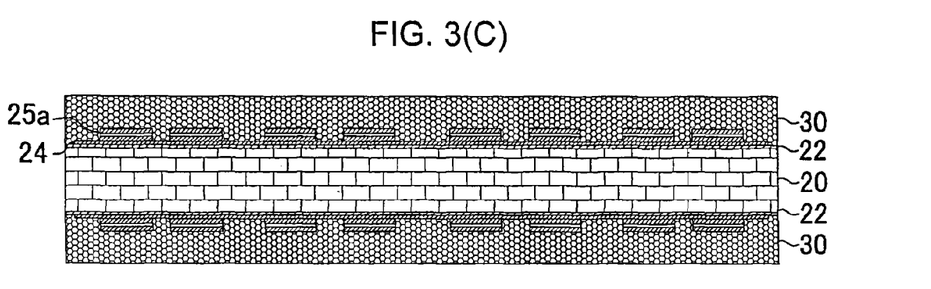

Resin film for interlayer resin insulation layers is laminated on copper foil 24 to form first resin insulation layer 30 (FIG. 3(C)).

Figure 3D:
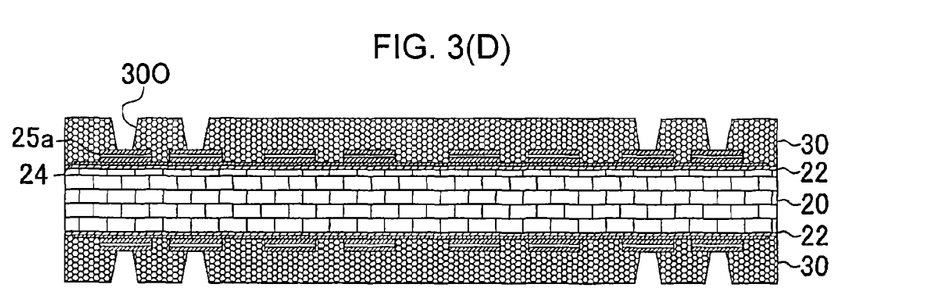

Using a laser, opening (300) reaching copper layer (25a) is formed in first resin insulation layer 30 (FIG. 3(D)).

Figure 4A:
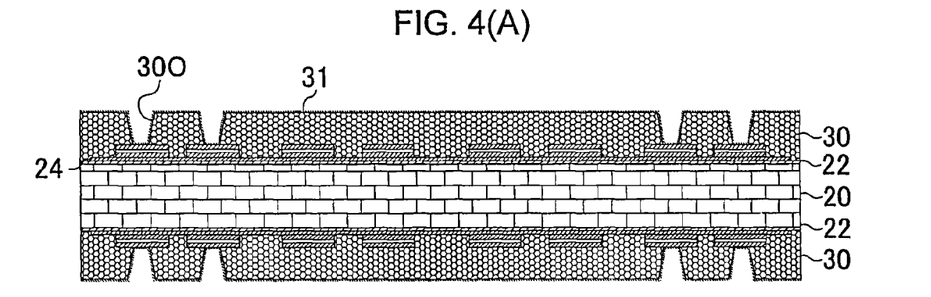
FIG. 4(A)-4(C) are views showing steps for manufacturing a printed wiring board according to the first embodiment.

Electroless plating is performed to form electroless copper-plated film 31 on the surface of first resin insulation layer 30 and in opening (300) (FIG. 4(A)).

Figure 4B:
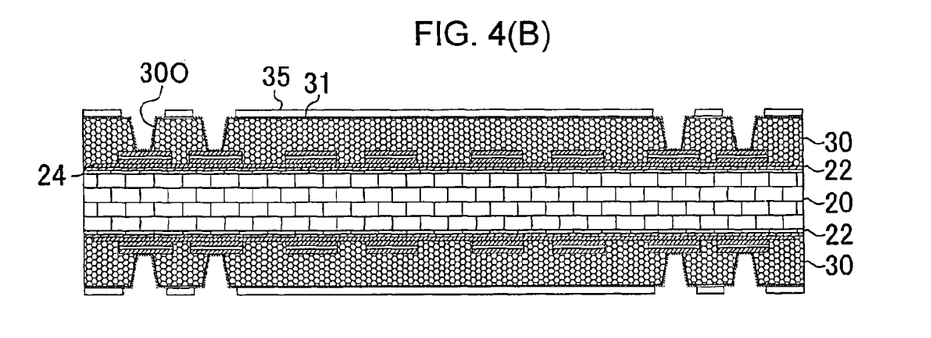

Plating resist 35 with a predetermined pattern is formed on electroless copper-plated film 31 (FIG. 4(B)).

Figure 4C:
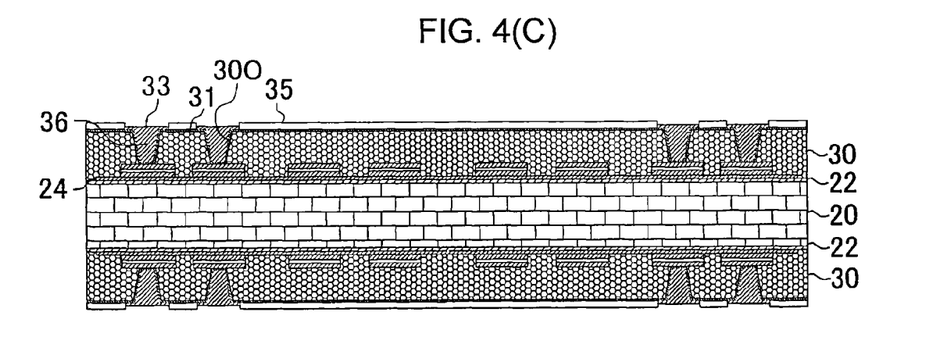

Electrolytic plating is performed to form electrolytic plated film 33 in portions where no plating resist 35 is formed (FIG. 4(C)). At that time, opening (300) is filled with the electrolytic plated film to form via conductor 36.

Figure 5A:
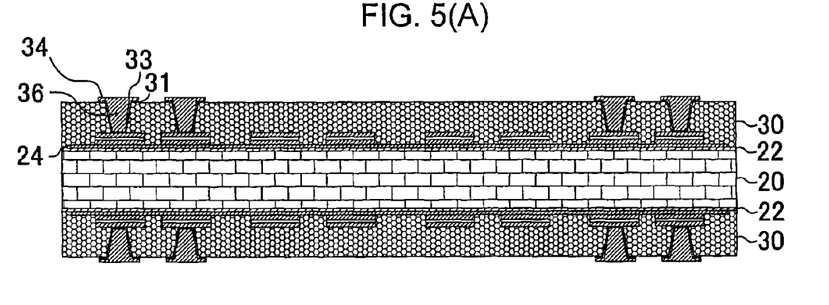
FIG. 5(A)-5(C) are views showing steps for manufacturing a printed wiring board according to the first embodiment.

The plating resist is removed, electroless copper-plated film 31 is removed from portions where no electrolytic plated film is formed, and first conductive layer 34 made up of electroless plated film 31 and electrolytic plated film is formed (FIG. 5(A)).

Figure 5B:
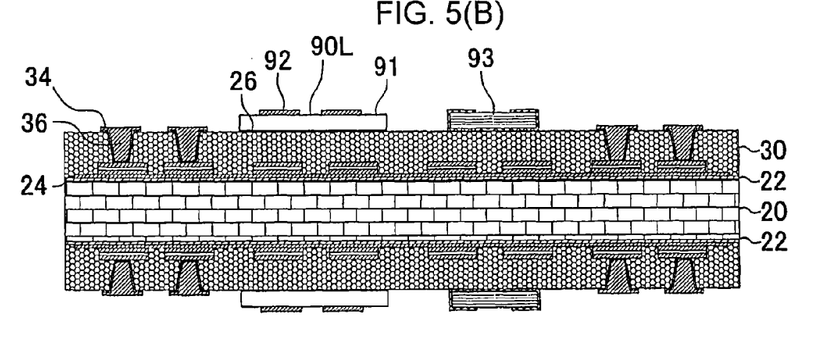
Figure 5C:
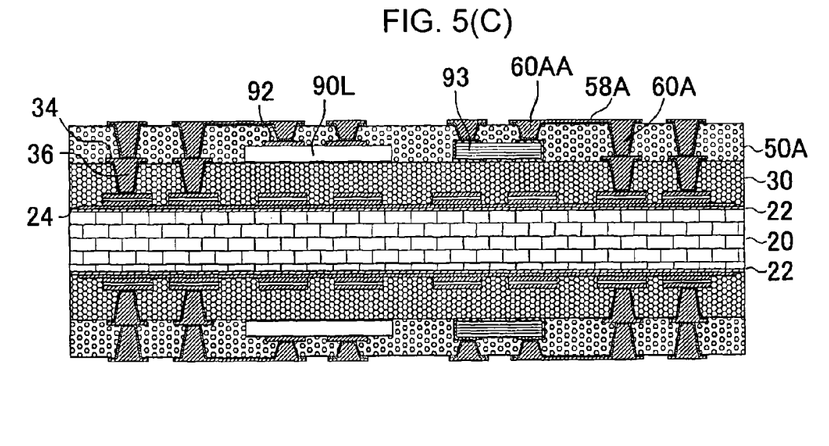

On predetermined positions of first resin insulation layer 30, logic IC chip (90L) with redistribution layer 91 and multilayer ceramic capacitor 93 are mounted with adhesive agent 26 in between (FIG. 5(B)).

By the same steps described above with reference to FIG. 3(C)~5(B), second resin insulation layer (50A) and second conductive layer (58A) are formed on first resin insulation layer 30. First conductive layer 34 and second conductive layer (58A) are connected by via conductors (60A), and electrode 92 of the IC chip and second conductive layer (58A) are connected by connection via conductor (60AA) (FIG. 5(C)).

By the same steps described above with reference to FIG. 3(C)~5(B), third resin insulation layer (50B) and third conductive layer (58B) are formed on second resin insulation layer (50A). Second conductive layer (58A) and third conductive layer (58B) are connected by via conductor (60B). By the same steps described above with reference to FIG. 3(C)~5(B), outermost third resin insulation layer (50C) and outermost third conductive layer (58C) are formed on third resin insulation layer (50B). Third conductive layer (58B) and outermost third conductive layer (58C) are connected by via conductor (60C) (FIG. 6(A)).

Figure 6A:
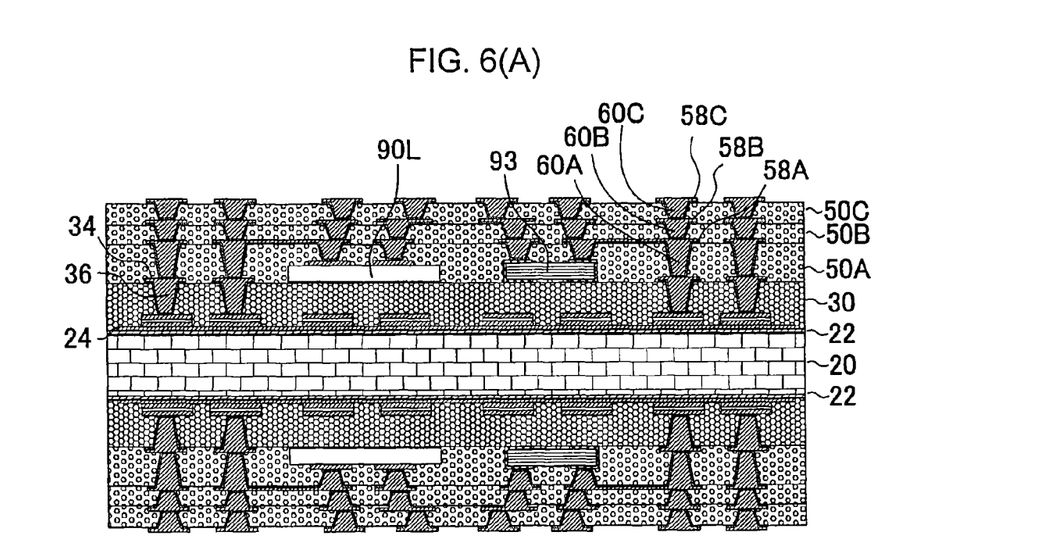
FIG. 6(A)-6(B) are views showing steps for manufacturing a printed wiring board according to the first embodiment.
Figure 6B:
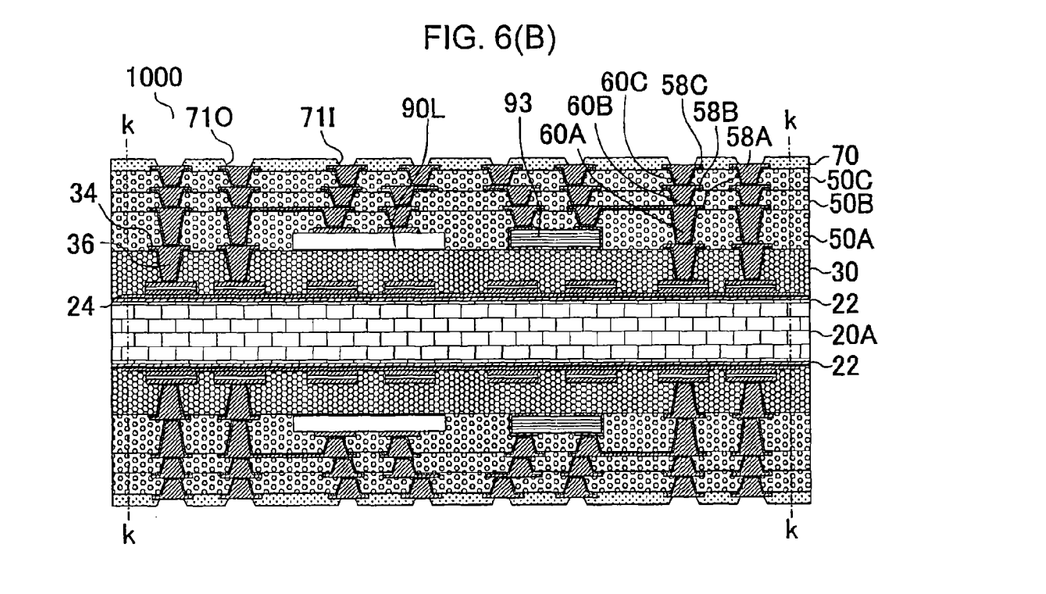

On the outermost third resin insulation layer (50C), solder-resist layer 70 is formed having smaller-diameter opening (71I) on the central side and larger-diameter opening (71O) on the peripheral side (FIG. 6(B)). Laminated substrate 1000 is completed.

Figure 7A:
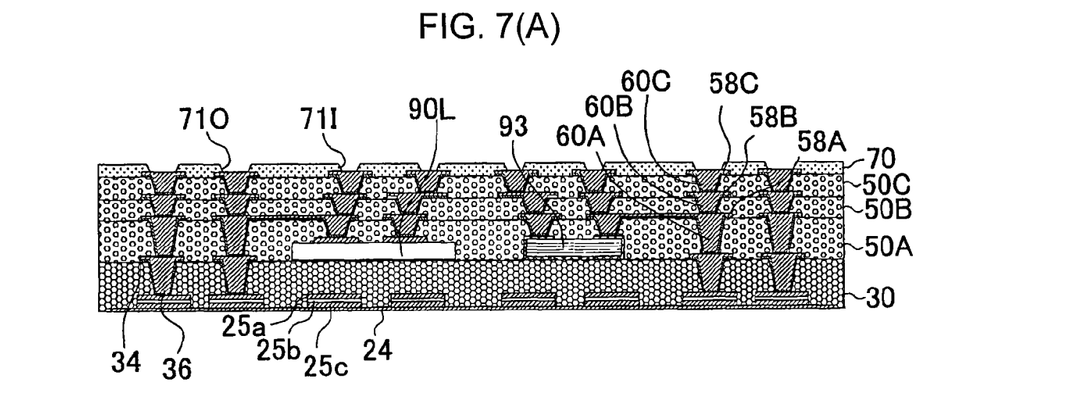
FIG. 7(A)-7(C) are views showing steps for manufacturing a printed wiring board according to the first embodiment.
Figure 7B:
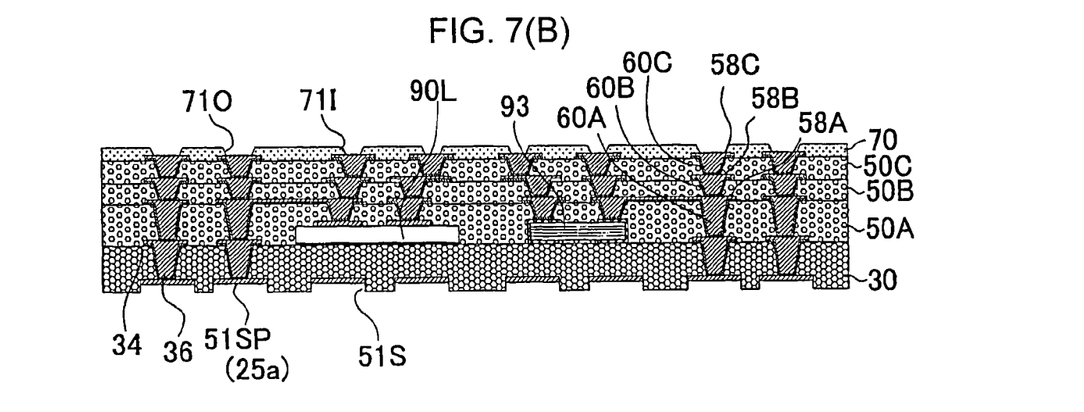

The laminated substrate is cut at (K-K) on the inner side of the bonded portion of copper foil 24 and double-sided copper-clad laminate (20A), and double-sided copper-clad laminate (20A) is removed (FIG. 7(A)).

Copper foil 24 and copper foil (25c) are selectively removed from laminated substrate 1000 by etching. "SF-5420" made by Mec Co., Ltd. may be used as the etching solution. Nickel layer (25b) under copper layer (25a) is selectively removed by etching and copper layer (25a) is exposed, and the exposed copper layer makes pad (51SP) (FIG. 7(B)). Recess (51S) of the first resin insulation layer is formed by the removal of copper layer (25c) and nickel layer (25b). Then, pad (51SP) is formed in recess in (51S).

Figure 7C:
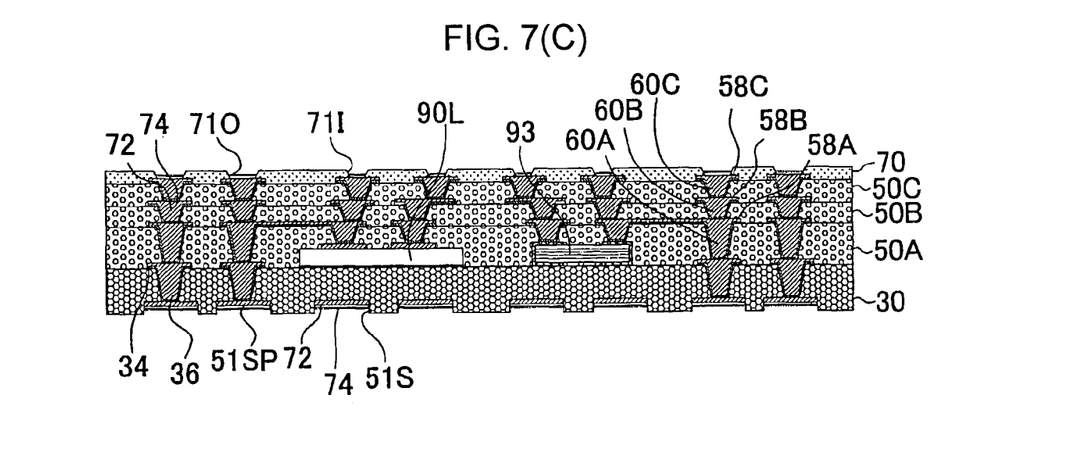
Figure 8:
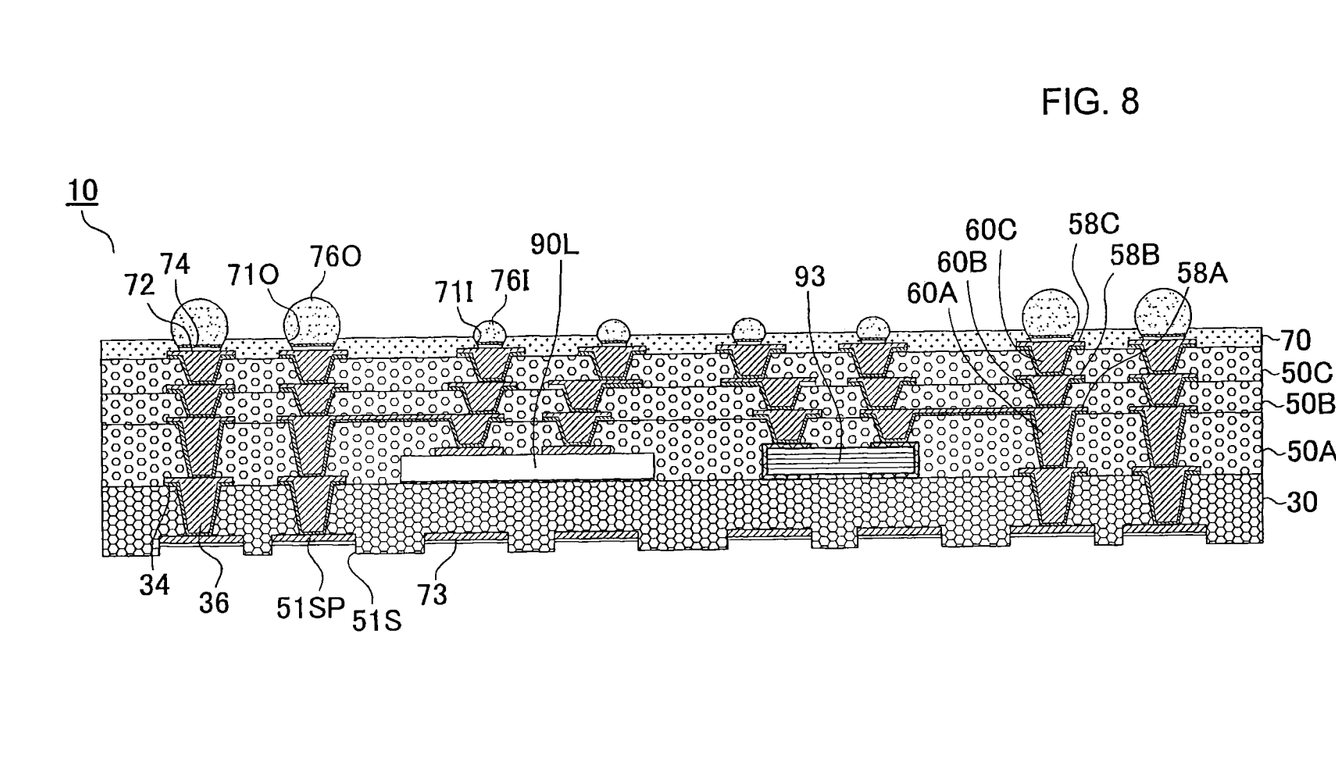
FIG. 8 is a cross-sectional view of a printed wiring board according to a first modified example of the first embodiment.

Ni film 72 and Au film 74 are formed on third conductive layer (58C) exposed from openings (71I, 71O) of solder-resist layer 70 and on pad (51SP) (FIG. 7(C)). Instead of Ni/Au film, metal film such as Ni/Pd/Au film or Sn film may also be formed. Instead of metal film, OSP 73 (organic film such as heat-resistant water-soluble preflux) may be formed on pad (51SP) as in a first modified example shown in FIG. 8. It is easier to form OSP film than to form metal film by plating.

Smaller-diameter bump (76I) is formed in smaller-diameter opening (71I) on the central side of solder-resist layer 70, and larger-diameter bump (76O) is formed in larger-diameter opening (71O) on the peripheral side of solder-resist layer 70 (FIG. 1).

Pad 292 of third IC chip 290 is connected through smaller-diameter solder bump (76I) on the central side of printed wiring board 10. Pad 112 of package substrate 110 with built-in memory chip 190 is connected through larger-diameter solder bump (76O) on the peripheral side of printed wiring board 10 (FIG. 2).

In a printed wiring board of the first embodiment, pad (51SP) is recessed from secondary surface (S) of first resin insulation layer 30. Thus, short circuiting of solder bumps on adjacent pads is less likely to occur.

Figure 9:
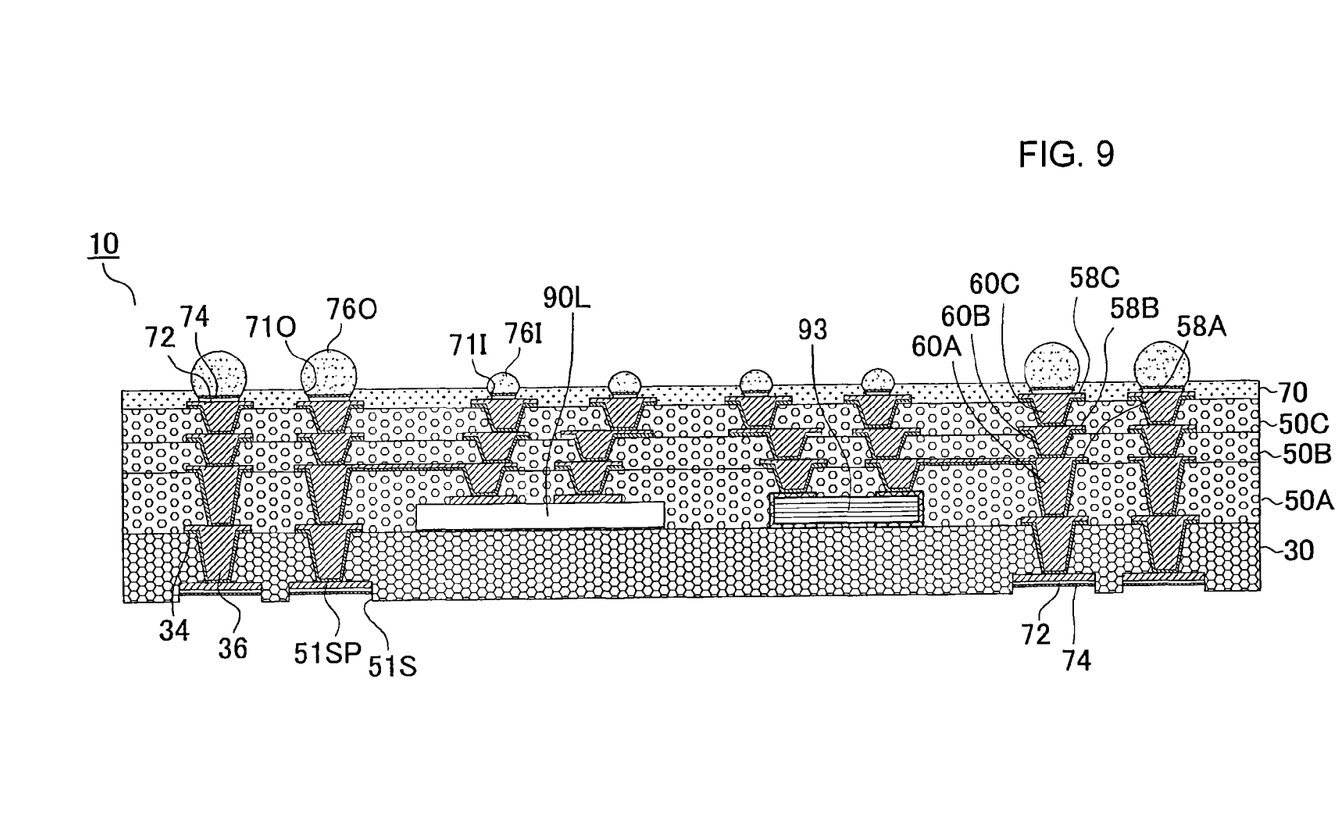
FIG. 9 is a cross-sectional view of a printed wiring board according to a second modified example of the first embodiment.

FIG. 9 shows a printed wiring board according to a second modified example of the first embodiment.

In a printed wiring board according to the modified example of the first embodiment, there is no pad directly under logic IC chip (90L) and multilayer ceramic capacitor 93. The effect of suppressing warping by the first resin insulation layer is further enhanced in the second modified example of the first embodiment.

Figure 10:
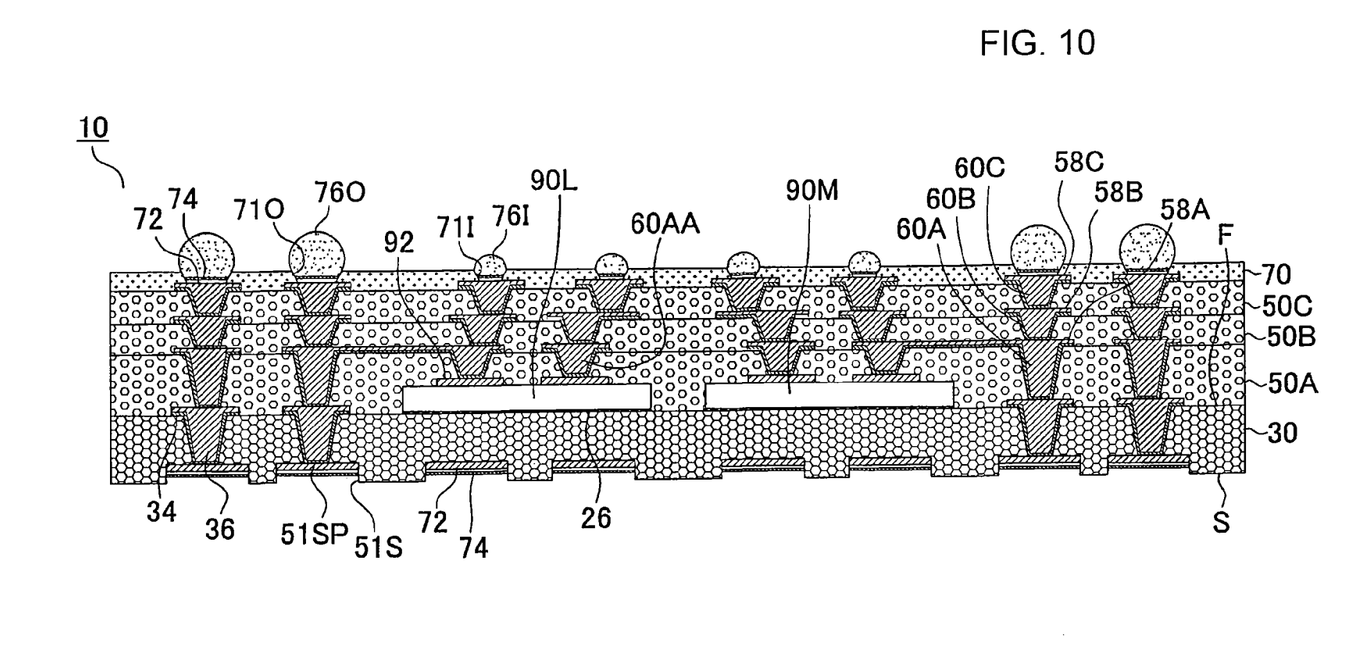
FIG. 10 is a cross-sectional view of a printed wiring board according to a third modified example of the first embodiment.

FIG. 10 shows a printed wiring board according to a third modified example of the first embodiment.

Memory IC chip (90M), along with logic IC chip (90L), is built into a printed wiring board according to the third modified example of the first embodiment.

Figure 11:
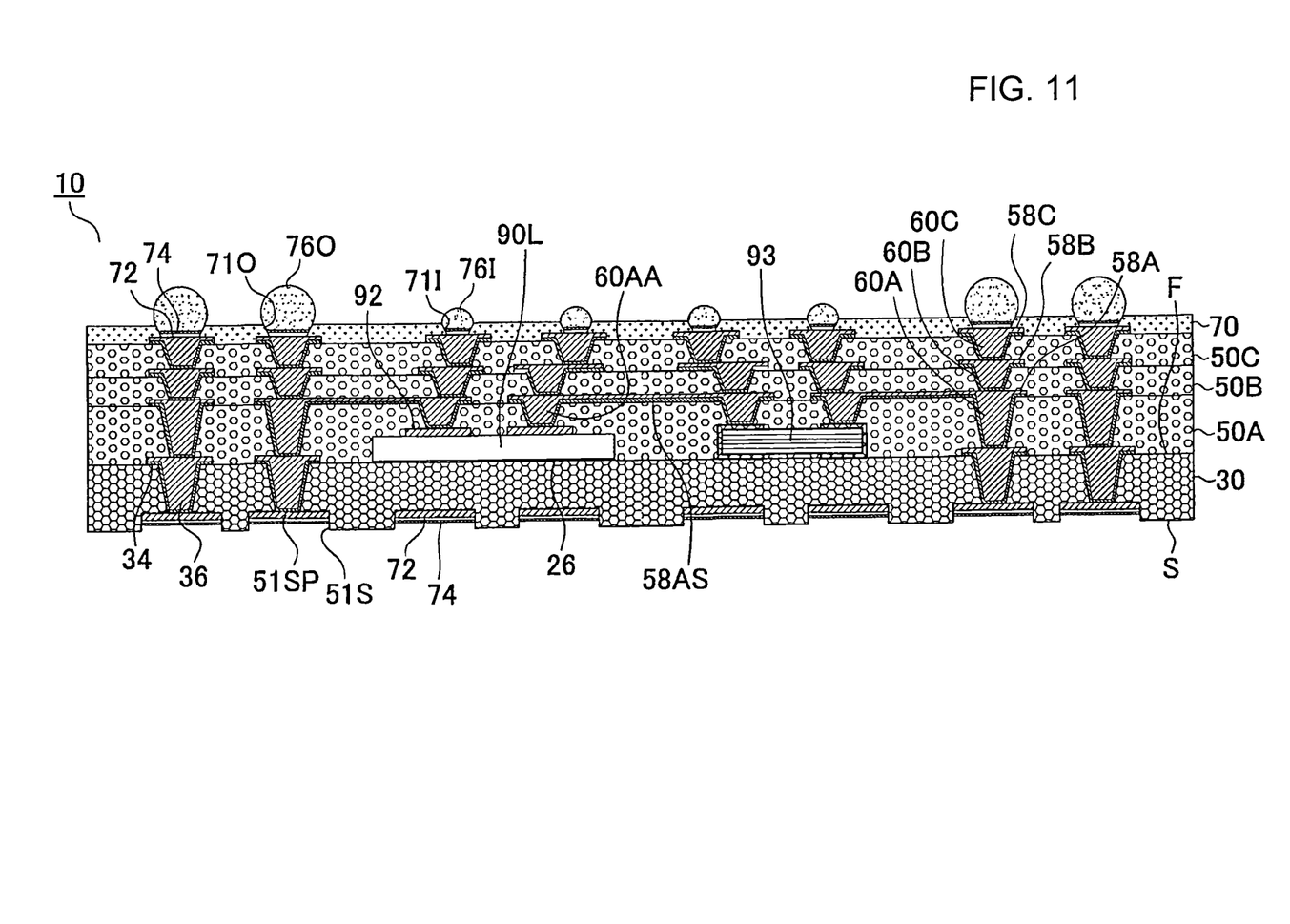
FIG. 11 is a cross-sectional view of a printed wiring board according to a fourth modified example of the first embodiment.

FIG. 11 shows a printed wiring board according to a fourth modified example of the first embodiment.

In a printed wiring board according to the fourth modified example of the first embodiment, logic IC chip (90L) and multilayer ceramic capacitor 93 are directly connected to each other by connecting line (58AS).

Second Embodiment

Figure 12:
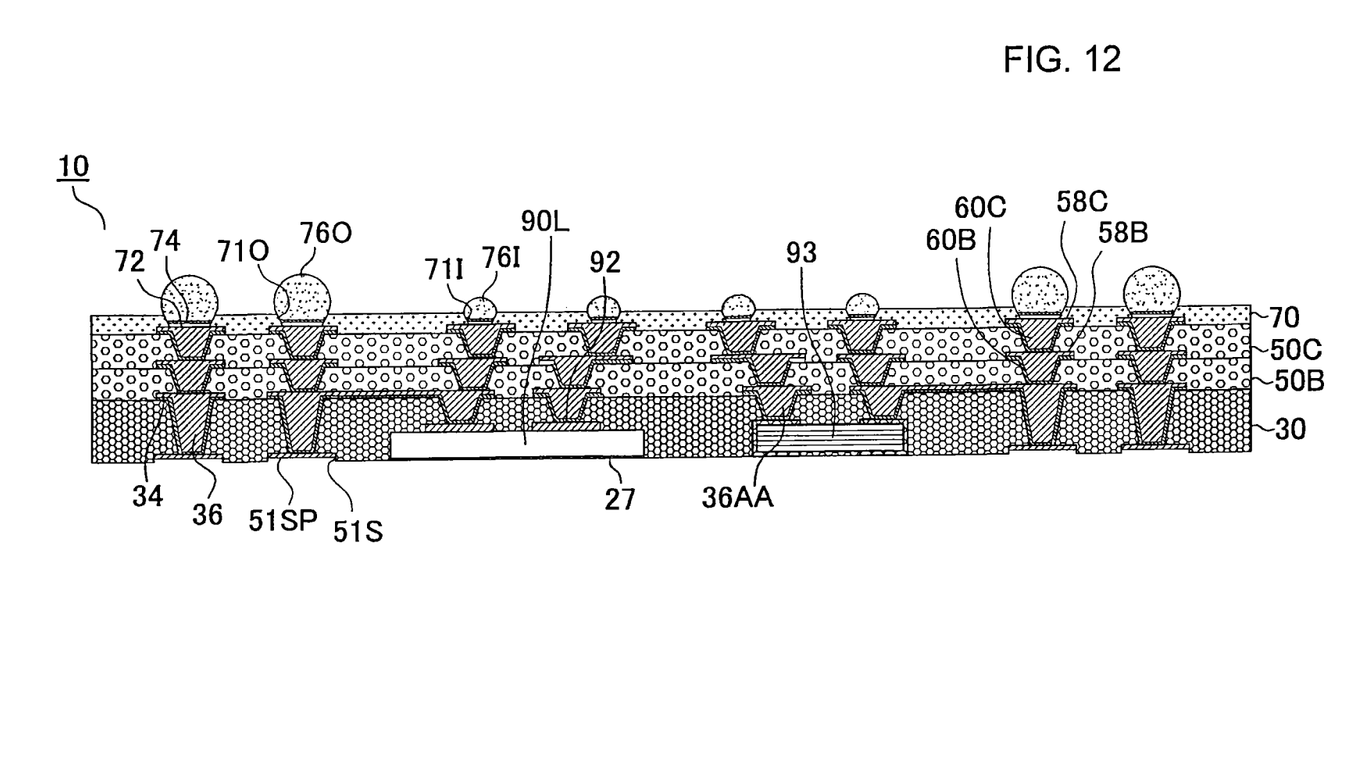
FIG. 12 is a cross-sectional view of a printed wiring board according to a second embodiment.

FIG. 12 shows a printed wiring board according to a second embodiment.

In the second embodiment, logic IC chip (90L) and multilayer ceramic capacitor 93 are embedded in first resin insulation layer 30, which has a low coefficient of thermal expansion. Printed wiring board 10 has the following: first conductive layer 34 on first resin insulation layer 30; third resin insulation layer (50B) on first resin insulation layer 30 and on first conductive layer 34; third conductive layer (58B) on third resin insulation layer (50B); outermost third resin insulation layer (50C) on third resin insulation layer (50B) and on third conductive layer (58B); and outermost third conductive layer (58C) on outermost third resin insulation layer (50C). On the lower surfaces of logic IC chip (90L), multilayer ceramic capacitor 93 and first resin insulation layer 30, adhesive layer (die attach) 27 made of silver paste or the like is formed, and the adhesive layer is exposed thereon. Pad (51SP) is formed in a position recessed from the secondary surface of first resin insulation layer 30. Pad (51SP) and first conductive layer 34 are connected by via conductor 36 penetrating through the first resin insulation layer. Electrode 92 of the IC chip and first conductive layer 34 are connected by connection via conductor (36AA). First conductive layer 34 and third conductive layer (58B) are connected by via conductor (60B) penetrating through the third resin insulation layer. Third conductive layer (58B) and outermost third conductive layer (58C) are connected by via conductor (60C) penetrating through outermost third resin insulation layer (50C). Solder-resist layer 70 is formed on outermost third resin insulation layer (50C). In solder-resist layer 70, opening (71I) with a relatively small diameter is formed on the central side, and opening (71O) with a relatively large diameter is formed on the peripheral side. Smaller-diameter solder bump (76I) is formed in smaller-diameter opening (71I), and larger-diameter solder bump (76O) is formed in larger-diameter opening (71O).

In the second embodiment, third resin insulation layer (50B) and outermost third resin insulation layer (50C) are made with the same composition, and their CTE (coefficient of thermal expansion) is approximately 30~40 ppm. First resin insulation layer 30 is made with the same resin composition as that of third resin insulation layer (50B) and outermost third resin insulation layer (50C) except that its CTE is adjusted by the amount of inorganic filler to be approximately 10~20 ppm, which is approximately ⅓-⅔ of the CTE of the third resin insulation layer and the outermost third resin insulation layer. The CTE of the solder-resist layer is adjusted to be in the mid-range between the CTE of the first resin insulation layer and the CTE of the third and outermost third resin insulation layers.

In a printed wiring board of the second embodiment, third resin insulation layers (50B, 50C) with a higher CTE are provided on first resin insulation layer 30 with a lower CTE. Because of a lower CTE, the first resin insulation layer warps in a direction that lowers the peripheral sides of the first resin insulation layer, offsetting the warping in a direction that raises the peripheral sides of third resin insulation layers, which have a greater CTE. Accordingly, the degree of warping in the printed wiring board is reduced.

In a printed wiring board of the second embodiment, lower surfaces of logic IC chip (90L), multilayer ceramic capacitor 93 and first resin insulation layer 30 are exposed, enabling a heat sink or the like to be attached directly thereon. Accordingly, heat radiation is excellent in the printed wiring board.

The embodiments above have described printed wiring boards with two built-in IC chips. However, that is not the only option; a printed wiring board may have only one IC chip built in, or instead of an IC chip, passive components such as a chip capacitor or the like may be built into the printed wiring board.

When an electronic component is embedded in a resin insulation layer of a printed wiring board, warping is likely to occur in the resin insulation layer near the peripheral sides of the highly rigid electronic component made of silicon, causing the printed wiring board to warp in a shape with raised peripheries. Accordingly, connection reliability is thought to decrease when another electronic component or a second printed wiring board is mounted on the printed wiring board.

A printed wiring board according to an embodiment of the present invention has a built-in electronic component and exhibits a smaller degree of warping.

A printed wiring board according to an embodiment of the present invention has the following: a first resin insulation layer having a main surface and a secondary surface opposite the main surface; an electronic component positioned on the main surface of the first resin insulation layer; a second resin insulation layer which is laminated on the main surface of the first resin insulation layer and is for embedding the electronic component; a third resin insulation layer laminated on the second resin insulation layer; a conductive layer formed on each of the first resin insulation layer, the second resin insulation layer and the third resin insulation layer; a via conductor formed in each of the first resin insulation layer, the second resin insulation layer and the third resin insulation layer; a connection via conductor to connect an electrode of the electronic component and the conductive layer on the second resin insulation layer; and a pad formed on the secondary-surface side of the first resin insulation layer. In such a printed wiring board, the thermal expansion coefficient of the first resin insulation layer is set lower than that of the second resin insulation layer and the third resin insulation layer.

In a printed wiring board according to an embodiment of the present invention, a first resin insulation layer is provided on a lower side of an electronic component, and the first resin insulation layer has a lower CTE (coefficient of thermal expansion) than either of the CTE of the second resin insulation layer in which the electronic component is embedded and the CTE formed on the second resin insulation layer. Because of a lower CTE, the first resin insulation layer warps in a direction that lowers the peripheral sides of the first resin insulation layer, offsetting the warping in a direction that raises the peripheral sides of the second and third resin insulation layers with a greater CTE. Accordingly, the degree of warping in the printed wiring board is reduced, and reliability is thereby enhanced when another electronic component and a second printed wiring board are mounted on the printed wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
    a first resin insulation layer;
    an electronic component positioned on a first surface of the first resin insulation layer;
    a second resin insulation layer formed on the first surface of the first resin insulation layer such that the second resin insulation layer is embedding the electronic component on the first surface of the first resin insulation layer;
    a conductive layer formed on the second resin insulation layer;
    a third resin insulation layer formed on the conductive layer and the second resin insulation layer; and
    a connection via conductor formed in the second resin insulation layer such that the connection via conductor is connecting an electrode of the electronic component and the conductive layer on the second resin insulation layer,
    wherein the first resin insulation layer has a pad structure formed on a second surface side of the first resin insulation layer on an opposite side with respect to the first surface, and the first resin insulation layer has a coefficient of thermal expansion which is set lower than a coefficient of thermal expansion of the second resin insulation layer and a coefficient of thermal expansion of the third resin insulation layer.

2. A wiring board according to claim 1, wherein the pad structure is formed on the second surface side of the first resin insulation layer such that the pad structure has a surface which is recessed with respect to a second surface of the first resin insulation layer on the opposite side with respect to the first surface.

3. A wiring board according to claim 1, wherein the second resin insulation layer has a thickness which is greater than a thickness of the first resin insulation layer.

4. A wiring board according to claim 1, wherein each of the first resin insulation layer, the second resin insulation layer and the third resin insulation layer does not contain a core material.

5. A wiring board according to claim 1, wherein the second resin insulation layer has the coefficient of thermal expansion which is substantially equal to the coefficient of thermal expansion of the third resin insulation layer.

6. A wiring board according to claim 1, wherein the pad structure has an organic film formed on a surface of the pad structure.

7. A wiring board according to claim 1, wherein the electronic component has a redistribution layer.

8. A wiring board according to claim 1, wherein the electronic component is fixed to the first surface of the first resin insulation layer through an adhesive material.

9. A wiring board according to claim 1, further comprising:
    a solder resist layer formed on an outermost resin insulation layer;
    a plurality of first solder bump structures positioned to connect a second electronic component in a center portion of the solder resist layer; and a plurality of second solder bump structures formed in a peripheral portion around the center portion of the solder resist layer such that the plurality of second solder bump structures is positioned to connect a second printed wiring board.

10. A wiring board according to claim 9, wherein the plurality of first solder bump structures is formed at a pitch which is smaller than a pitch of the plurality of second solder bump structures, and the plurality of second solder bump structures has a height which is greater than a height of the plurality of first solder bump structures.

11. A wiring board according to claim 9, wherein the solder resist layer has a coefficient of thermal expansion which is lower than the coefficient of thermal expansion of the second resin insulation layer and the coefficient of thermal expansion of the third resin insulation layer.

12. A wiring board according to claim 1, further comprising:
a second electronic component positioned on the first surface of the first resin insulation layer,
wherein one of the electronic component and the second electronic component is a passive electronic component.

13. A wiring board according to claim 12, wherein the electronic component is electrically connected to the second electronic component.

14. A wiring board according to claim 12, wherein the passive electronic component is a multilayer ceramic capacitor.

15. A wiring board according to claim 1, further comprising:
a plurality of via conductors formed in the first resin insulation layer, the second resin insulation layer and the third resin insulation layer, respectively.

16. A wiring board according to claim 1, further comprising:
a conductive layer formed on the first resin insulation layer; and
a conductive layer formed on the third resin insulation layer.

17. A wiring board according to claim 16, further comprising:
a plurality of via conductors formed in the first resin insulation layer, the second resin insulation layer and the third resin insulation layer, respectively,
wherein the plurality of via conductors is formed such that the plurality of via conductors is connecting the conductive layers formed on the first resin insulation layer, the second resin insulation layer and the third resin insulation layer.

18. A wiring board according to claim 1, further comprising:
a solder resist layer formed on the third resin insulation layer;
a plurality of first solder bump structures positioned to connect a second electronic component in a center portion of the solder resist layer; and
a plurality of second solder bump structures formed in a peripheral portion around the center portion of the solder resist layer such that the plurality of second solder bump structures is positioned to connect a second printed wiring board.

19. A wiring board according to claim 18, wherein the plurality of first solder bump structures is formed at a pitch which is smaller than a pitch of the plurality of second solder bump structures, and the plurality of second solder bump structures has a height which is greater than a height of the plurality of first solder bump structures.

20. A wiring board according to claim 18, wherein the solder resist layer has a coefficient of thermal expansion which is lower than the coefficient of thermal expansion of the second resin insulation layer and the coefficient of thermal expansion of the third resin insulation layer.

* * * * *